United States Patent [19]

Yee

[11] 4,339,723
[45] Jul. 13, 1982

[54] PULSE WIDTH DISCRIMINATOR

[75] Inventor: Henry C. Yee, Royal Oak, Mich.

[73] Assignee: The Bendix Corporation, Southfield, Mich.

[21] Appl. No.: 114,795

[22] Filed: Jan. 24, 1980

Related U.S. Application Data

[62] Division of Ser. No. 942,003, Sep. 13, 1978.

[51] Int. Cl.³ .............................................. H03K 5/22
[52] U.S. Cl. .................................... 328/111; 328/112; 307/234
[58] Field of Search ............... 307/510, 514, 234, 265, 307/273; 328/111, 112, 133

[56] References Cited

U.S. PATENT DOCUMENTS

| 3,555,434 | 1/1971 | Sheen | 307/234 |
| 3,713,145 | 1/1973 | Butler et al. | 328/112 |
| 3,735,271 | 5/1973 | Leibotz | 328/112 |
| 3,943,382 | 3/1976 | Hermansdorfer et al. | 307/234 |

Primary Examiner—Stanley D. Miller, Jr.
Assistant Examiner—B. P. Davis
Attorney, Agent, or Firm—Markell Seitzman; Russel C. Wells

[57] ABSTRACT

A pulse width discriminator using a negative logic technique including two monostable multivibrators for generating test pulses and a D-latch for generating an output signal in response to the test pulses indicating that the received signal is of a predetermined length.

3 Claims, 12 Drawing Figures

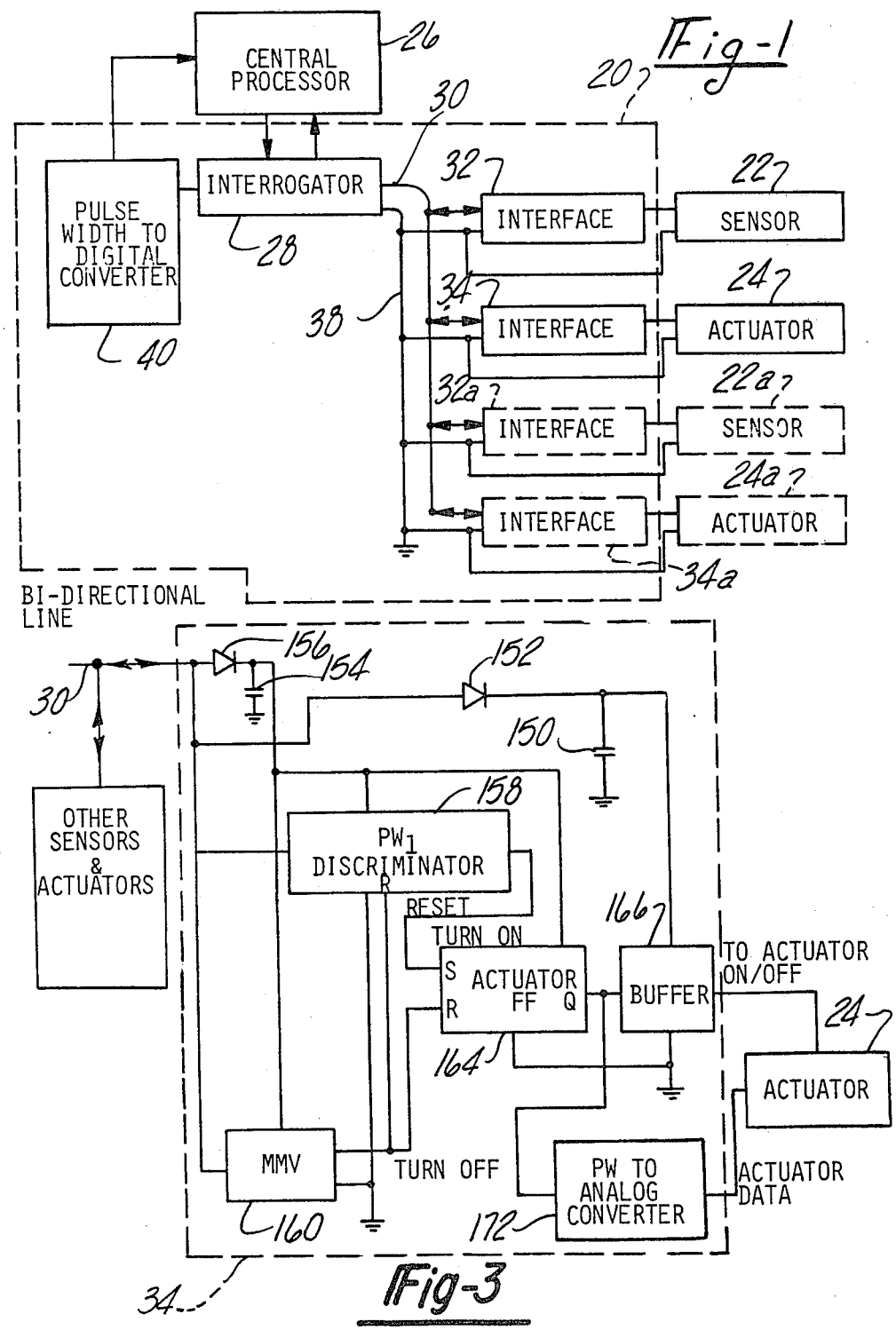

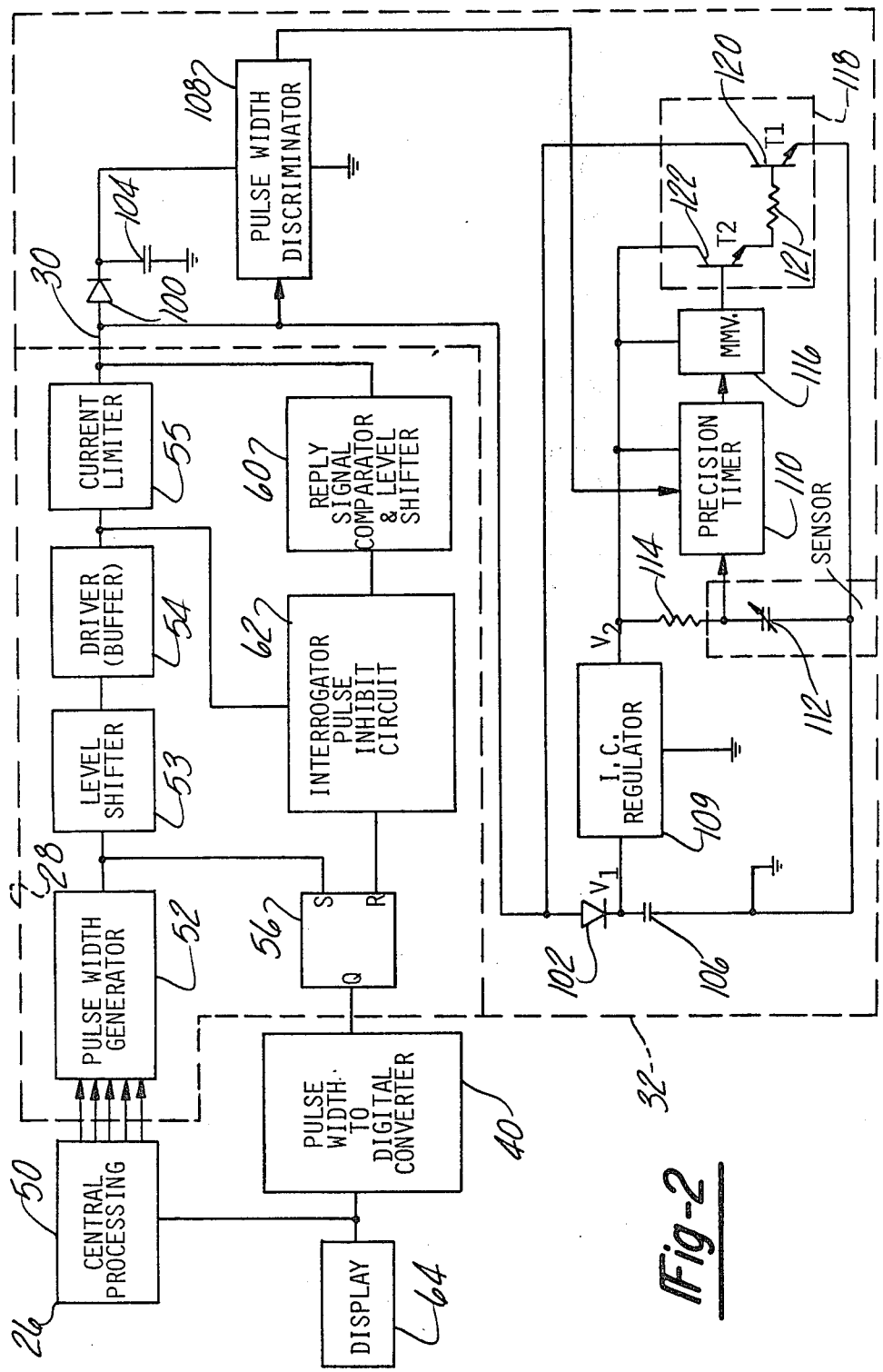

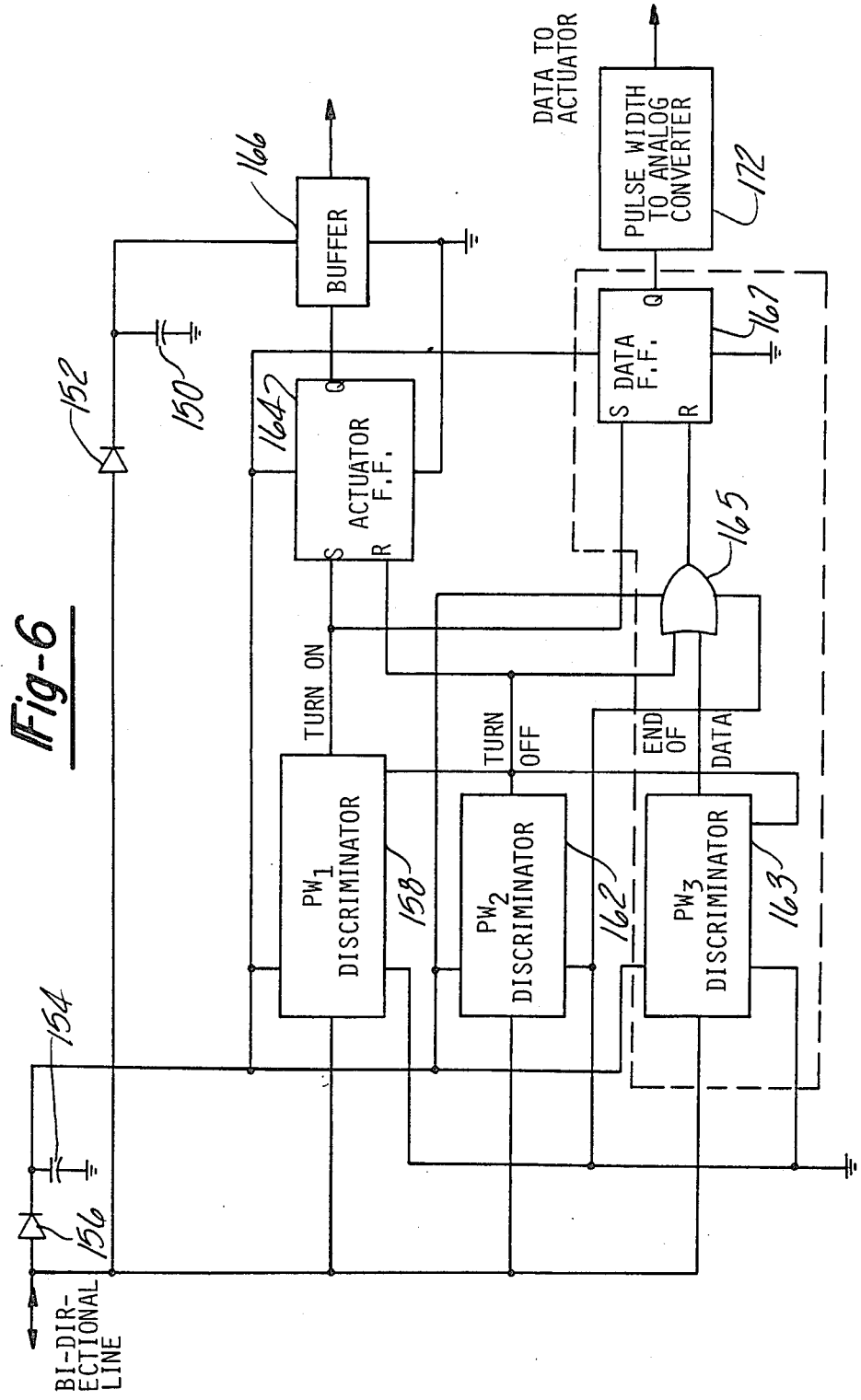

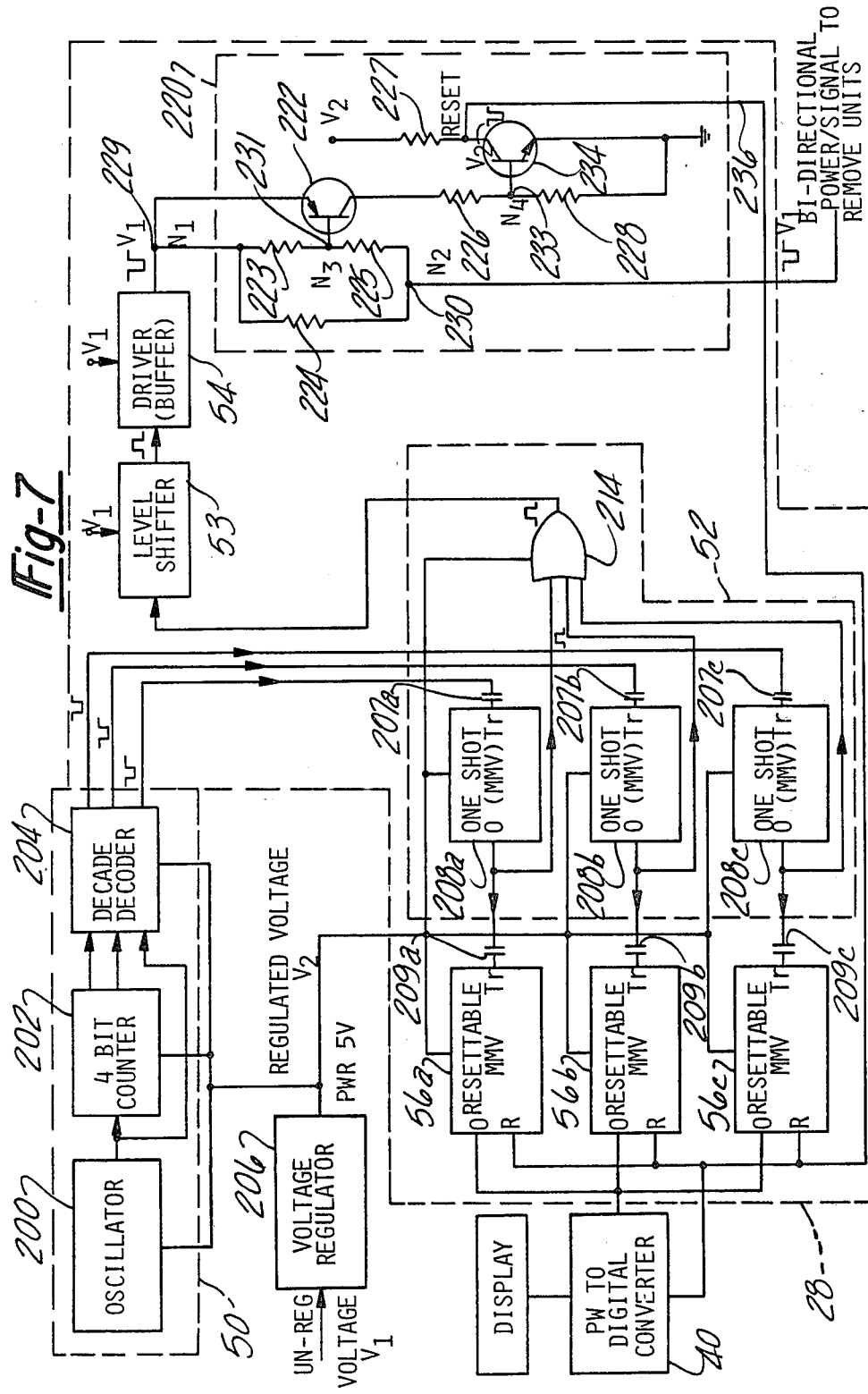

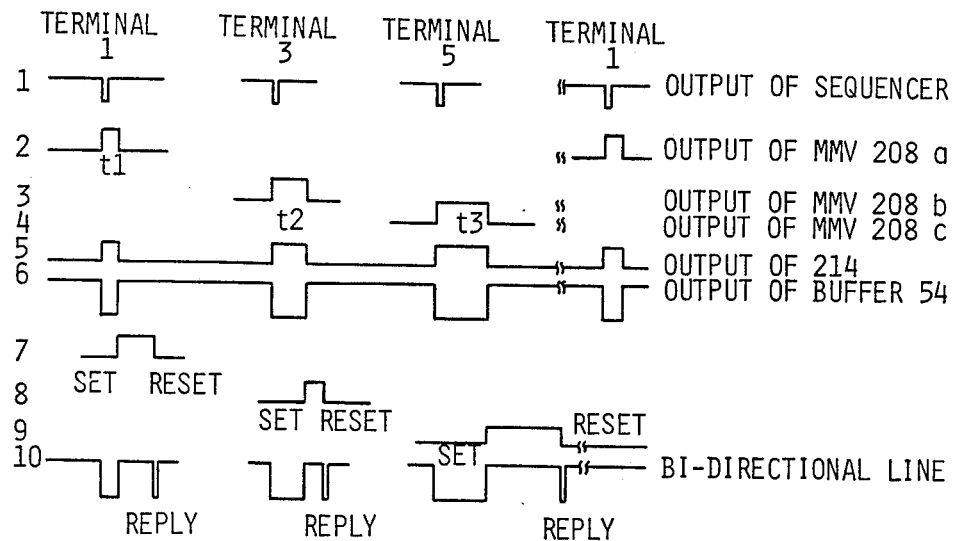
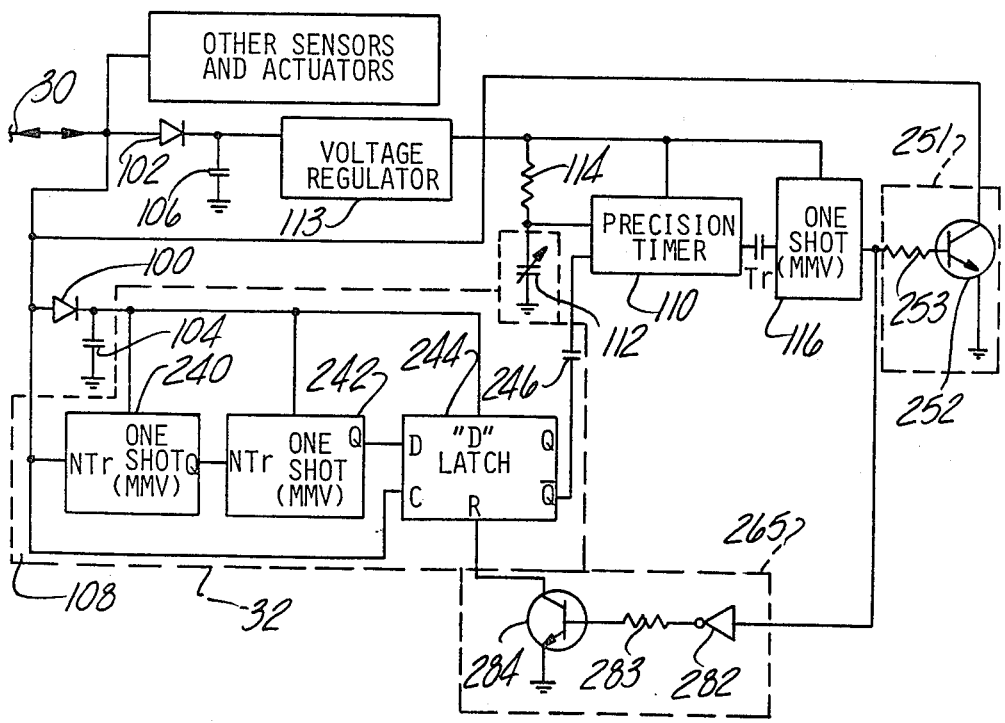

PULSE WIDTH DISCRIMINATOR

This is a division of application Ser. No. 942,003, filed Sept. 13, 1978.

BACKGROUND OF THE INVENTION

1. Field of the Invention

The invention relates to data handling systems in particular to apparatus, systems and methods for interrogating, transmitting and receiving data and control signals between a control processor and a number of remotely located transducers and actuating devices.

2. Description of the Prior Art

Electronic data interface systems are employed to communicate information between a central processing unit and a plurality of remotely situated units. These sensors are largely analog due in part to the analog nature of physical phenomena. Digital central processing units comprising such devices as microprocessors can be used with the necessary interface circuitry to communicate with analog devices. Analog devices exhibit a greater sensitivity to noise pick-up than do digital devices making it more difficult to maintain measurement fidelity in noisy environments. Those sensors that are considered digital include devices having only two states or devices incorporating electronic conversion to a binary format. Digital devices while having a greater noise immunity than its analog counterpart often require more electrical lines for data transfer.

Prior art intercommunications between a plurality of analog sensors and a digital processor is disclosed in U.S. Pat. No. 3,059,228 to Beck et al. issued Oct. 16, 1962. Beck teaches a multiwire system which simultaneously samples and holds a plurality of voltages. These voltages are later combined into a composite signal forming a series of analog voltages on a common lead. This composite signal is later successively digitized. The use of a single cable transmission system is taught by Penter in U.S. Pat. No. 3,132,329 issued May 5, 1964. Penter, as in Beck, requires that the remote device have its own power supply. Fergus in U.S. Pat. No. 3,678,512 issued on July 18, 1972 employs a single bi-direction transmission line using an analog-to-pulsewidth conversion encoding technique employing a trilevel interrogation voltage signal. In Fergus the length of the transmission line is clamped to ground is indicative of the value of the sensed variable.

Demand responsive telemetry systems capable of selectively polling remote devices is shown in Higginbotham in U.S. Pat. No. 3,538,504 issued Jan. 15, 1968 using programmable remote processing units controlled by a central digital computer. In Rawson et al. U.S. Pat. No. 3,566,365 issued Feb. 23, 1971 a central computer is again used to selectively poll outlying stations, each having a transducer, at a predetermined time and at a predetermined rate. Data is transmitted via a multi-wire cable using a 12-bit digital word. Both Higginbotham and Rawson while incorporating a sophisticated computer for control purposes still require separate external power sources at each test site.

Hadden in U.S. Pat. No. 3,717,858 issued Feb. 20, 1973 teaches a telemetering system having a single sensor located remotely from a base station where communication and power linkages are through a single two-way cable plus ground link. Analog data is encoded so that the repetition rate of a train of pulses is indicative of the quantity being sensed. The polarity of each pulse is of opposite voltage to the power signal supplied by the base station. Pulse width discrimination is accomplished by Hadden in U.S. Pat. No. 3,742,473 issued June 26, 1973 wherein a pulse generator, located at the base station charges a capacitor through a switching transistor such that the charging time is equal to the minimum pulse width to be discriminated. In Whiteside U.S. Pat. No. 4,103,337 issued on July 25, 1978 held by the assignee of present invention, teaches an analog to pulse width to digital data transmission system that can selectively or sequentially communicate with a plurality of remote sensors. Power, data, sensor activation and sensor reply signals are all sent via a single bi-directional line. Sensor interface circuitry is selectively activated upon decoding of an interrogation signal that is simultaneously received by all interfaces. The interrogation signal is comprised of a predetermined number of pulses. These pulses are sensed by a plurality of decoding units having shift registers. If the number of pulses corresponds to the number of storage locations minus one the appropriate sensor is then activated. The interface generates a low impedance to ground reply signal, the duration of which is indicative of the analog sensed value. The processor terminates the transmission of the data signal when it detects the low impedance to ground reply signal. In addition, the system utilizes power that is available from the interrogation pulse, thereby implicitly requiring that sufficient power be transferred to enable interface circuitry to encode the sensor information in the time between pulses.

As it can be seen most prior art telecommunications systems involve cmmunications with remote sensors which transmit only data. Venema in U.S. Pat. No. 3,651,454 issued Mar. 21, 1972 discloses a multiplexing system for automotive application having both sensors; i.e. a data transmitter and data receiving devices. Sequential data transfer is accomplished utilizing a delay one-shot multivibrator responsive to a periodic clock pulse. Fergus, previously discussed, additionally teaches transmitting a coded series of pulses that is used to activate independently powered remotely located control receivers. The disclosed system is an improvement over the prior art discussed above.

It is an object of the invention to provide a multiplexing system capable of selectively communicating with a plurality of sensors and actuators via a single 2 wire communication link. A further object is to simplify the method of transfer of electrical power from a transmitting location to sensors and actuators and their respective interface networks. A still further object of this invention is the command capability of independent control of a number of actuators. Another object of the present invention is to provide for a refigurable and flexible multiplexing system having the capability of operating with the addition or removal of sensor and actuator units.

SUMMARY OF THE INVENTION

The invention is an efficient solution to command signal and data signal transmission, reception and analog-to-digital conversion problems associated with intercommunications systems having central digital processors linked to control systems employing analog sensors and actuators. The system contains a central processor that can selectively request data from any one of a plurality of sensor units or independently activate any of a plurality of actuator units by having an interrogator generate and transmit a unique coded signal via a single bi-directional line. The coded signal employs a negative logic encoding technique for addressing interface circuitry; pulse width coding was chosen because of its simplicity. The coded signal is simultaneously sent to all of the interfacing units via the bi-directional line.

Each coded signal is examined by a pulse width discriminator in every sensor and actuator interface unit to determine if the signal corresponds to the pulse width code uniquely assigned to it. Selective activation of a sensor or actuator is accomplished by a two part recognition test performed by a pulse width discriminator within each interface unit. A first pulse is initiated relatively simultaneously in each interface unit upon receipt of the negative going edge of the pulse width coded signal. The duration of this pulse is $(t_i - \Delta)$ seconds where $t_i$ is the pulse width uniquely assigned to the specific interface unit. A second relatively short pulse of a fixed duration, $2\Delta$ seconds, is triggered by the trailing edge of the first pulse. Typically the duration of these pulses will vary from a few microseconds to milliseconds. The pulse width coded signal is tested, to see if it disappears during the occurrence of the second pulse. If this test is passed, the specific interface unit is activated.

Upon selective activation of a sensor interface a precision timer is activated. The period of the timer is governed by the sensor. When the timer resets, a multivibrator generates a reply pulse pulling the bi-directional line to ground potential. The time interval between the transmission of the pulse coded signal by the interrogator and receipt of the reply signal by the interrogator is indicative of the value of the parameter being sensed.

In addition, the system is so configured to provide for activation, data transmission and turn-off of selective actuators.

In addition, supplementary power sources are not necessary since power is supplied to the interfaces, sensors and actuators from the bi-directional line. To facilitate power transmission to each interface, sensor and actuator, the bi-directional line is maintained at a positive potential except during those brief intervals of communicationss between the interrogator and interface units.

BRIEF DESCRIPTION OF THE FIGURES

FIG. 1 is a simplified block diagram of the data communication system.

FIG. 2 is a more detailed diagram of the data communication system illustrating the interrogator and sensor interface circuitry.

FIG. 3 is a block diagram detailing typical actuator interface circuitry.

FIG. 6 shows another embodiment of the actuator interface.

FIG. 7 shows a detailed embodiment of the interrogator of FIG. 2.

FIG. 8 includes waveforms generated by circuit of FIG. 7.

FIG. 9 illustrates a detailed embodiment of a typical sensor interface.

DETAILED DESCRIPTION OF THE PREFERRED EMBODIMENT

Figure 4:
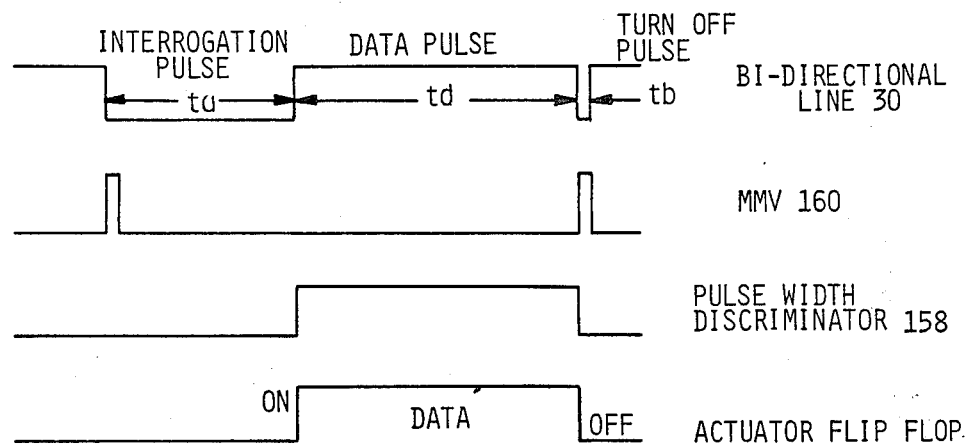
FIG. 4 shows the time sequence of the actuator interrogation waveform and signals generated by the actuator interface.

The basic elements of the present invention are shown in FIG. 1. A Communicator means 20 such as a multiplexor is shown linking a plurality of remotely located Sensors 22 and Actuators 24 with a digital Central Processor 26. It will be obvious that system can operate with one remote device. The Communicator 20 is responsive to the commands of the Central Processor 26 and permits selective communication with specific Sensors 22 and Actuators 24 that have been identified by the Central Processor 26. The Communicator 20 further includes an Interrogator 28 that is linked to a single wire transmission line, Bi-directional Line 30. The Bi-directional Line 30 carries signals including power, data transfer, commands, etc. to a plurality of Sensor Interfaces 32 and Actuator Interfaces 34 wherein each interface contains means for discriminating the selective communications sent by the Central Processor 26. The Communicator 20 further includes a Converter 40 connected to the Central Processor 26 which converts received pulse width signals to a digital signal for use by the Processor 26.

In addition to carrying signal information the Bi-directional Line 30 supplies power from the Interrogator 28 for use by each Sensor 22, Actuator 24 and Interface. In the preferred embodiment, the Bi-directional Line 30 is a single wire 36 having a common ground Return 38 such as a wire, or common chassis to which each Sensor Interface 32 and Actuator Interface 34 Unit is connected. In this manner, the Bi-directional Line 30 forms a closed loop linking the Interrogator 28 with outlying interface units. The closed path makes it possible to connect to the loop at any point so that Sensor 22, Actuator 24 and Interface 32,24 units can be added to or removed from the system while permitting other interface units to remain connected to the Interrogator 28. While FIG. 1 shows a system comprised of both Sensors 22 and Actuators 24, it is obvious that the system is operable when configured with only Sensors 22 or Actuators 24.

Each Sensor 22 is of the type that can change its physical state causing a signal to be generated or alternatively cause a change in a system parameter such as resistance or capacitance, thereby indicating the value of the variable to be measured such as the temperature of a fluid or the acceleration of a mass. Each Actuator 24, in turn, can cause a change to occur in a physical state of a variable such as the closing of a switch or the controlled movement of a load. The sophistication and complexity of the Central Processor 26 will vary depending upon the particular application of the invention. The Central Processor 26 can be a mini or microcomputer capable of issuing commands to the outlying units on a demand basis or as described in the preferred description and can be a sequencing device systematically interrogating the outlying units.

The operation of the system shown in FIG. 1 is as follows. The Central Processor 26 identifies the specific Sensor Interface 32 or Actuator Interface 34 and instructs the Interrogator 28 to transmit a coded interrogation signal via the Bi-directional Line 30 to each remote Sensor and Actuator Interface unit 32, 34. Many coding techniques are available such as a predetermined number of pulses, or a pulse sequence where the width of the pulses or gaps between pulses is indicative of binary ONE'S and ZERO's. The preferred embodiment utilizes a negative logic binary code having single pulses of predetermined durations wherein each interface unit can recognize, or discriminate, only one pulse of a specific duration. The Interfaces units (32,34) are initially in a standby operational mode awaiting selective activation upon recognition of a coded interrogation signal. Prior to and in the absence of an interrogation signal a constant voltage potential power signal is impressed upon the Bi-directional Line 30. This power signal is stored at each Interface Unit 32 and 34 for use by each Sensor 22 and Actuator 24. One skilled in the art will realize that Actuators 24 normally require their own power sources because of their relatively large current demands. However, if an Actuator 24 requires only a few 10s of milliamps its total power requirements can be taken directly from the Bi-directional Line 30.

For a particular Interface Unit 32 and 34 to be activated it must discriminate from the many signals on the Bi-directional Line 30 and respond to the unique coded signal personal to it. Pulse width discrimination is performed relatively simultaneously in all Interface Units 32 and 34. Pulse width discrimination is achieved by causing each Interface Unit 32 and 34 to generate two sequential test pulses. The first pulse is initiated simultaneously in each Interface unit upon receipt of the negative going edge of the interrogation pulse and having a duration of $(t_i - \Delta)$ seconds.

A second, relatively short pulse of a fixed duration $2\Delta$ seconds is triggered by the trailing edge of first pulse. The variable $t_i$ is the pulse duration assigned to the $i^{th}$ Interface unit. The interrogation signal is tested to see if it disappears during the second pulse. In the preferred embodiment the second pulse is tested at the end of the interrogation signal. If this second pulse is present, the selected interface unit is activated. If the test is passed the selected Interface unit is activated. As an example if it is desired to activate Sensor Interface 32a which has been designed to be responsive to a pulse of duration $t_1$ seconds, the Interrogator 28 initiates an interrogation pulse which reduces the constant potential power signal of the Bi-directional Line 30 to ground potential for $t_1$ seconds. Typically, interrogation pulses will have a duration of a few microseconds to a few milliseconds. Since the Sensor Interface 32a is the only interface unit that can generate a first test pulse of $(t_1 - \Delta)$ seconds it will be the only interface unit activated. Upon interface activation the associated sensor, in this case Sensor 22a, is interrogated and a reply signal is sent to the Interrogator 28 via the Bi-directional Line 30. The reply signal similarly clamps the Bi-directional Line 30 to ground; however, its pulse width has been calibrated to differ from any of the acceptable interrogator generated pulse widths to avoid confusion. To utilize the available transmission time efficiently the reply pulse duration is made extremely short, perhaps 1 microsecond. The time interval between the end of the interrogation pulse and received reply pulse is indicative of the magnitude of the sensed variable. This time interval between the interrogation and reply pulse is communicated to a Pulse Width to Digital Converter 40 which creates a digital signal that can be used by the Central Processor 26.

In the case of an Actuator 24 additional interrogation signals are usually necessary such as a coded signal to shut off the actuator or coded magnitude information to command the Actuator 24. These features as well as those previously indicated will be discussed in greater detail later.

Referring now to FIG. 2, there is shown a more detailed block diagram of the data communication system of FIG. 1. The Central Processor 26, the Pulse Width to Digital Converter 40 and Bi-direction Line 30 remain as described in FIG. 1, however, a Display Device 64 is additionally shown receiving its input from the Pulse Width to Digital Converter 40. The Interrogator 28 comprises a Pulse Width Generator 52, a Level Shifter 53, a Driver 54 such as a buffer amplifier stage, a current Limiter 55, a Reply Signal Comparator and Level Shifter 60, Inhibit Circuitry 62, and a data pulse storage device such as a Resettable Monostable Multivibrator (MMV) 56.

The decoded signal output of the Central Processor 26 is input to the Pulse Width Generator 52. The output of the Pulse Width Generator 52 referred to as interrogation pulses, is input to a Level Shifter 53 and to the Set terminal of MMV 56. The output of Level Shifter 53 is buffered by Driver 54. The output of the Driver 54 is Current Limited by Block 55. The output of the Current Limiter 55 is connected to the Bi-directional Line 30 and to a reply signal buffer comprising Level Shifter 60. The output node of Level Shifter 60 is in common with the output of Driver 55 and is connected to the input of the Inhibit Circuitry 62; the output of which is used to reset the multivibrator MMV 56.

The operation of the Central Processor 26 and Interrogator 28 portion of the system shown in FIG. 2 is as follows.

Assuming the Central Processor 26 seeks to communicate with one of the remotely situated Sensors 22 or Actuators 24. The Central Processor 26 generates a coded signal indicative of the particular remote device. The Pulse Width Generator 52 responds to the coded signal and generates a pulse width signal assigned to the particular remote Sensor 22 or Actuator 24. The trailing edge of the pulse width signal sets Multivibrator 56. The pulse width signal is amplified by Level Shifter 53. Typically, if integrated circuit components are used, the amplitude or swing of the signals produced by the Pulse Width Generator 52 are of the order of 5 volts. The Level Shifter 53 is employed to increase the magnitude of these pulses. The amplified pulse width signals are buffered and placed upon the Bi-directional Line 30 through the Driver 54 and Current Limiter 55.

The Resettable Monostable Multivibrator 56 remains in the Set mode until reset by a reply signal generated at the remote location. The reply signal is a ground signal on the Bi-directional Line 30 not originating in the Interrogator 28. Level Shifter 60 senses the reply signal and generates a reset signal resetting MMV 56. Inhibit Circuitry 62 prevents a reset signal from being communicated from the Level Shifter 60 to the Resettable Monostable Multivibrator 56 during the generation of the interrogation signal. In the preferred embodiment the functions performed by the Level Shifter 60, Inhibit Circuitry 62 and Current Limiter 62 may be consolidated into a single integrated circuit as shall be discussed later.

A Resettable Monostable Multivibrator as opposed to a flip-flop is used in the preferred embodiment because it provides an inherent reset function and in the absence of a received reply signal generated by the remote units, will automatically return itself to a stable state after a predetermined time.

The length of time the Resettable Monostable Multivibrator 56 remains in its Set state is indicative of the magnitude of the sensed variable, except of course for that unusual condition when the MMV 56 times itself out, that is to say, returns itself to its quiescient operating condition. One skilled in the art will note that a single MMV 56 has been shown in FIG. 2. This is due to the nature of the Central Processor 26, such as a microprocessor, which has supervisory control over the interrogation and reply signals and is able to properly coordinate their transmission and receipt. Pulse Width to Digital Converter 40 converts the output of MMV 56 to a digital signal which is communicated back to the Central Processor 26 completing the signal loop as previously shown in FIG. 1, or to a Display 64 as shown in FIG. 2.

Referring now to the right hand portion of FIG. 2 there is shown the Bi-directional Line 30 communicating with a plurality of remotely situated Sensors 22 and Actuators 24, however, only one Sensor Interface 22a unit with a variable capacitance 112 Sensor 22a is shown in detail. Actuator 24 and Actuator Interface 34 communications are discussed with reference to FIGS. 3 and 4.

Each Sensor Interface 32 is identical in operation and structure with the exception of differences which permit each particular Sensor Interface 32a, b, c, etc. to respond to its uniquely assigned interrogator transmitted coded signal. These differences pertain to the Pulse Width Discriminator 108 and are discussed in greater detail in conjunction with FIGS. 8 through 12.

The Sensor Interface 32 in FIG. 2 embodies two distinct portions; the first portion comprising a Pulse Width Discrimination 108, Diode 100 and Storage Capacitor 104. The function of this first portion of the Sensor Interface 32 is to examine each interrogation pulse and activate the second portion of the interface circuitry upon recognition of a unique pulse width signal. The second portion of the Sensor Interface Circuitry 32 includes a Diode 102, storage Capacitor 106, a three-terminal voltage Regulator 109, a precision Timer 110 (i.e. a precision One Shot Multivibrator) whose output is defined by a Capacitance 112 and Resistance 114 wherein either the Resistance 114 or Capacitance 112 is associated with Sensor 22, a Monostable Multivibrator (MMV) 116, and reply signal Buffer Circuit 118.

Returning now to the first portion of the Sensor Interface 32, the anode of Diode 100 is connected to the Bi-directional Line 30, its cathode is connected in common to one terminal of Capacitor 104, and the power input terminal of Pulse Width Discriminator 108. The other terminal of the Capacitor 104 is grounded. The signal input terminal of the Pulse Width Generator 108 is connected to the Bi-directional Line 30; its signal output terminal communicates with the trigger input of the precision Timer 110.

The basic structure of the second portion of the Sensor Interface is as follows: Diode 102 is connected to the Bi-directional Line 30. The cathode of Diode 102 is connected in common to one terminal of Capacitor 106 and the input terminal of the three terminal Voltage Regulator 109. The other terminal of Capacitor 106 is grounded. The output terminal of Voltage Regulator 109 is connected to the elements of the second portion of the interface requiring regulated power. The output terminal of the voltage Regulator 109 is also connected to the capacitor 112-Resistance 114 combination which are connected to precision Timer 110. The output of Timer 110 is connected to the trigger terminal of Monostable Multivibrator (MMV) 116. The output of the MMV 116 is input to the reply signal Buffer 118. The input terminal of Buffer 118 is the base lead of Transistor $T_2$ (122). The emitter of Transistor 122 is coupled to the base of Transistor 120 through the Resistor 121 and its collector is connected to the regulated supply; the collector terminal of Transistor 120 is connected to the Bi-directional Line 30.

The general operation of the Sensor Interface 32 is as follows.

The Bi-directional Line 30 is normally maintained at or near the supply voltage $V_1$ except during thos instants when it is carrying an interrogation or reply signal. The Diodes 100 and 102 permit the storage capacitors 104 and 106 respectively, to store energy from the Bi-directional Line 30 while providing a degree of electrical isolation thereby preventing discharge of the storage capacitors during those moments when the Bi-directional Line 30 is at or near ground potential. The Pulse Width Discriminator 108 communicates with and receives its power from storage Capacitor 104, while the remainder of the Sensor Interface 32a is powered by energy from storage Capacitor 106. In the preferred embodiment the Pulse Width Discriminator 108 utilizes CMOS (Complementary Symmetry/ Metal - Oxide Semiconductor) circuitry that enables it to function well during supply line variations. Upon recognizing a specific pulsewidth signal, the Pulse Width Discriminator 108 triggers the precision Timer 110, a one shot, whose period is governed by Sensor 22, illustrated as a capacitive transducer. The combination of the Capacitive Transducer 112 and fixed external Resistor 114 completely determine the period of the precision Timer 110. Alternatively, if a variable resistance tranducer is to be incorporated within the system, the Capacitance 112 would be replaced by a fixed value while the Resistor 114 would in fact be the variable resistance Sensor 22. When the Timer 110 resets, the trailing edge of its signal triggers a one shot, a Monostable Multivibrator 116, having a very short period typically 1 microsecond, thereby generating a reply signal. This reply signal causes the Buffer 118, to momentarily pull the Bi-directional Line 30 to ground potential. The reply signal Buffer 118 as shown may be a two transistor buffer comprising transistors $T_1$, 120 and $T_2$, 122 connected as a Darlington pair when extra gain is needed. If extra gain is not required, one transistor may be eliminated. In order to avoid confusion, the reply pulse is significantly shorter than any interrogation pulse. The reply pulse causes each Sensor Interface 32 circuit to be reset and is simultaneously transmitted to the Level Shifter 60 of the Interrogator 28 momentarily dropping the output of Level Shifter 60 from a reference level to ground potential thereby resetting the Resettable Monostable Multivibrator 56. A more detailed description of the operation of Level Shifter 60 and the inhibit function provided by Block 62 will be given later in conjunction with the operation of FIG. 7.

A typical Actuator Interface 34 is shown in FIG. 3. The structure of the Actuator Interface 34 includes a pair of Diodes 152, 156 connected to the Bi-directional Line 30. The cathode of Diode 152 is connected in common to Storage Capacitor 150 and the power terminal of a Buffer 166 amplifier. The output of the Buffer 166 is connected to the on/off terminal of Actuator 24.

The cathode of Diode 156 is commonly connected to one terminal of storage Capacitor 154 and to the power input terminals of the Pulse Width Discriminator 158, the Monostable Multivibrator (MMV) 160, and the Actuator Flip-Flop 164. Signal information from the Bi-directional Line 30 is communicated directly to the input terminal of the Pulse Width Discriminator 158 and to the MMV 160. The signal output of the Pulse Width Discriminator 158 is fed to the Set terminal of Actuator Flip-Flop 164. The output of MMV 160 is connected to the Reset terminals of both the Pulse Width Discriminator 158 and actuator Flip-Flop 164. The signal output of Flip-Flop 164 drives the Buffer 166 and is also connected to the input of a Pulse Width to Analog Converter 166. The output of Converter 166 is communicated to the data input terminal of Actuator 24.

The general structure of the Pulse Width Generator 158 and the method of pulse width discrimination used here and in alternate embodiments of the Actuator Interface 32 are identical with that of the Pulse Width Discriminator 108 of the Sensor Interface 32 and are not described here in detail; however, detilas of a typical pulse width discriminator are shown on FIGS. 9, 10, 11 and 12 and discussed relative thereto.

As shown in FIG. 3, power for each Actuator Inteface 34 is obtained from the Bi-directional Line 30 in the identical manner as is used for each Sensor Interface 24 of FIG. 2. Actuator power is obtained from the Storage Capacitor 150 which is charged via the Bi-directional Line 30 through Diode 152. The Diode 152 provides discharge protection when the Bi-directional Line 30 is grounded during Interrogator 28 and interface communications. Power and discharge protection for the remainder of the Actuator Interface 34 circuitry is obtained from Storage Capacitor 154 and Diode 156 respectively. In addition to supplying power to the remote Actuator such as Actuator 24, the Actuator Interface 34 can also turn the appropriate Actuator 24 on and off and communicate supplied data to command the Actuator 24 to a new state.

The Central Processor 26 instructs the Interrogator 28 to first generate a coded interrogation pulse. The information transmitted in the coded interrogation pulse will turn on a particular Actuator Interface 34, then if required the central Processor will subsequently transmit a data pulse to the identified Actuator 24.

The voltage signal level on the Bi-directional Line 30 resulting from the actuator interrogation pulse and data pulse are shown in Line 1, FIG. 4. The format of the actuator interrogation pulse is as follows. The Bi-directional Line 30 is grounded for a duration of $t_a$ seconds which corresponds to the unique pulse width interrogation code that has been assigned to the Pulse Width Discriminator 158 of Interface 24. The first portion of this pulse represents a turn-on command signal. The Bi-directional Line 30 is returned to its quiescent or high voltage state for a period of $t_d$ seconds. The duration of the pulse $t_d$ is determined by the magnitude of data to be transmitted to the Actuator 22. Finally, the Interrogator 28 generates a very short, perhaps 1 microsecond, ground pulse $t_b$ to indicate the termination of data transmission and to turn off Actuator 24a. The actuator turn-off signal may be a pulse having a duration equal to that of the sensor reply signal. It should be recognized that the Interrogator 28 will not confuse these two signals since one is generated by a remote unit while the other signal is generated within the Interrogator 28. The falling edge of the turn-on pulse will trigger a Monostable Multivibrator (MMV) 160. The MMV 160 will generate a very short pulse resetting the Actuator Flip-Flop 164 and similarly resetting the Pulse Width Discriminator 158. The output of MMV 160 is shown on Line 2 of FIG. 4. The falling edge of pulse $t_a$ will activate every actuator Pulse Width Discriminator 158 in the system; however, only one Pulse Width Discriminator 158 will recognize and accept this coded signal and generate an output signal as shown on Line 3 of FIG. 4. The Pulse Width Discriminator 158 will set the Actuator Flip-Flop 164 upon recognition of the appropriate interrogator pulse.

It should be noted that the falling edge of any pulse appearing on the Bi-directional Line 30 will cause MMV 160 to generate a reset pulse; however, the reset pulse has significance only when occurring after the Pulse Width Discriminator 158 has activated Flip-Flop 164. This relationship can be seen from the following example. If an Actuator 24 is initially off then Actuator Flip Flop 164 is in a reset state and additional MMV 160 reset pulses are of no consequence. However, when the Actuator Flip-Flop 164 has been set by the Pulse Width Discriminator 158 the next signal to be placed upon the Bi-directional Line 30 will be the Interrogator 28 transmitted turn-off pulse $t_b$. The falling edge of the turn-off pulse triggers the MMV 160 which in turn resets the Actuator Flip-Flop 164 and Pulse Width Discriminator 158 and turns off the Actuator 24. The duration of time that the Actuator Flip-Flop 164 is set is sensed by a Pulse Width to Analog Converter 172 which generates an analog signal that is equivalent to the data pulse width $t_d$. In essence, actuator 24a turn-on is accomplished using the Pulse Width Discriminator 158 and rapid actuator turn off is accomplished utilizing a simple and inexpensive Monostable Multivibrator 160.

Figure 5:
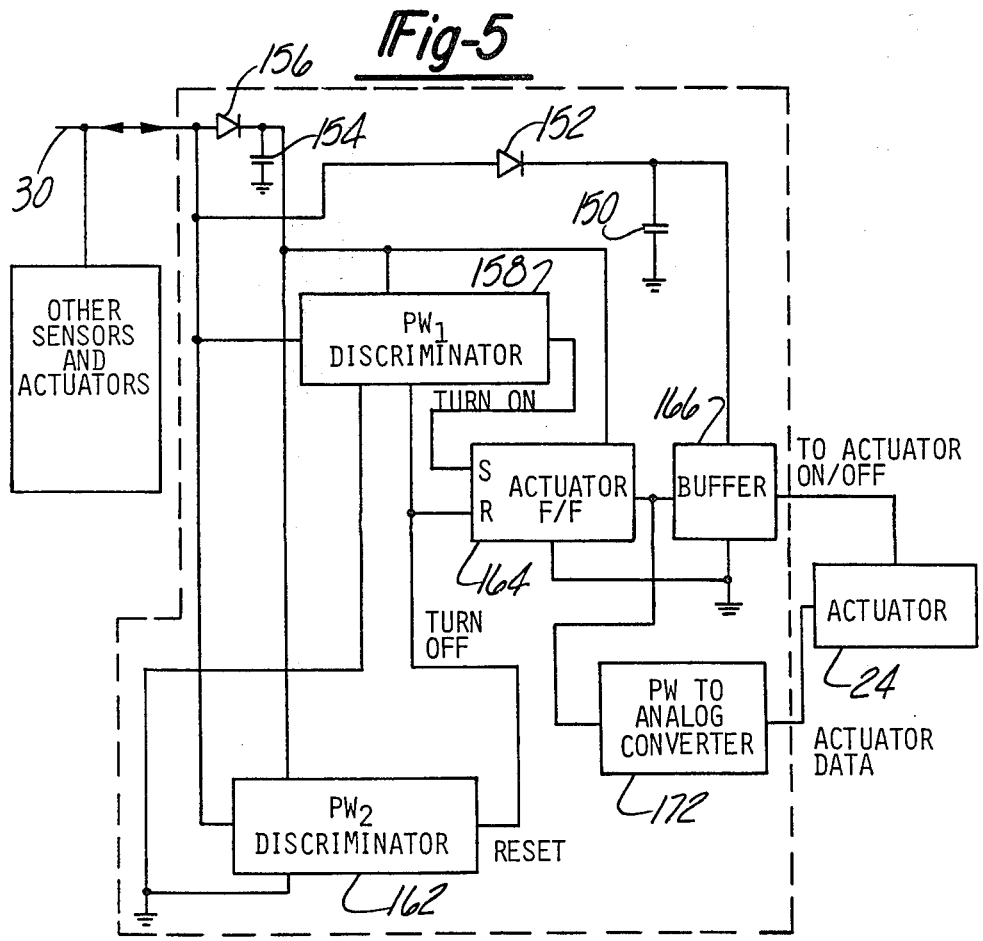
FIG. 5 shows an alternate embodiment of the actuator interface shown in FIG. 3.

An alternate embodiment of the Actuator Interface 34 is shown in FIG. 5. The circuit is identical to that shown in FIG. 3 except that the MMV 160 has been replaced by a second Pulse Width Discriminator 162. The Pulse Width Discriminator 162 is similarly connected to and receives power from Capacitor 154 and receives signal information through a connection to the Bi-directional Line 30. The output connections of the Pulse Width Discriminator 162 are the same as MMV 160. The circuit of FIG. 5 is more flexible as well as more costly than the circuit of FIG. 3. The basic difference between the two circuits resides in the fact that to turn-off the Actuator 24 requires the Interrogator 28 to transmit a separate pulse width $t_b$ to be discriminated by this second Pulse Width Discriminator. In this alternate embodiment $t_b$ is not restricted to the short turn-off MMV 160 reset pulse. To retain the identical operational mode of the interface of FIG. 3 the Interrogator 28 must serially transmit a pulse width $t_a$ identifiable as a turn-on pulse, then return the Bi-directional Line 30 to its quiescent level for $t_d$ seconds, corresponding to the previously discussed pulse width encoded data signal and then finally transmit a ground pulse of a duration $t_b$ uniquely assigned to the second discriminator 162. Upon recognition of the $t_b$ pulse width, the actuator is turned off.

The Actuator Interface 32 of FIG. 5 can be operated to drive a simpler actuator; i.e. one not requiring transmitted data such as an ON/OFF actuator. Obviously, since pulse width encoded data cannot be used by this type of actuator the Pulse Width-To-Analog Converter 172 of FIG. 43 may be omitted. The operation of the interface in conjunction with the ON/OFF actuator is virtually identical to that previously discussed and will not be described in detail. It is sufficient to relate that in an ON/OFF mode of operation it is not necessary to transmit the tur-on, turn-off pulses serially. To turn-on Actuator 24 the Interrogator 28 must transmit a signal having a pulse width assigned to Pulse Width Discriminator 158. The Actuator 24 will remain on for an indeterminate length of time until the Interrogator 28 transmits the turnoff signal having a pulse width assigned to Pulse Width Discriminator 162. Upon recognition of this turn-off pulse signal the Pulse Width Discriminator 162 generates an output which resets both Pulse Width Discriminator 158 and Actuator Flip-Flop 164 which then turns off the Actuator 24 and readies the Actuator Interface 34 to accept newly transmitted signals.

Referring now to FIG. 6 there is shown another embodiment of the Actuator Interface 32. This embodiment includes many of the components common to the previously described embodiments of FIGS. 3 and 5. In particular the Storage Capacitors 150 and 154, the Diodes 152 and 156, a first and second Pulse Width Discriminator 158 and 162, an actuator Flip-Flop 162, Buffer 166 and Pulse Width-To-Analog Converter 172. This embodiment further includes a third Pulse Width Discriminator 163, and OR Gate 165 and a second (data) Flip-Flop 167 shown within the dotted lines of FIG. 6. One skilled in the art will recognize that if the components 163, 165 and 167 are removed, the resulting circuit is virtually identical to that of FIG. 5. This obviously requires the signal output of Flip-Flop 164 to be reconnected to the Pulse Width to Digital Converter 172.

Only those characteristics which distinguish the structure and operation of the embodiment of FIG. 6 from FIGS. 3 and 5 will be discussed. The signal output of the Pulse Width Discriminator 158 in addition to being connected to the actuator Flip-Flop 164 is connected to the Set terminal of the data Flip-Flop 167. The output of Flip-Flop 167 is connected to the data input of the Pulse Width to Analog Converter 172, and the output of the Converter 172 communicates with the data terminal of an actuator (not shown). Pulse Width Discriminator 163 is connected to and receives its power from Storage Capacitor 154 and receives signal information from the Bi-directional Line 30; its output is connected to one input of the OR Gate 165. The output of OR Gate 165 is connected to the Reset terminal of the data Flip-Flop 167. In addition, the output of Discriminator 162 is used to reset the third Pulse Width Discriminator 163 as well as communicated to the other input of OR Gate 165. It should also be noted that the signal output of Actuator Flip-Flop 164 is now connected only to the Buffer 166.

The operation of the embodiment shown in FIG. 6 is as follows. This embodiment incorporates the features of the embodiment of FIG. 3 requiring the Actuator Interface 34a to be turned on, pulse width encoded data transmitted and the resetting of data Flip-Flop 167 and features of the embodiment of FIG. 5 which permits the actuator (not shown) to stay on indefinitely.

When it is desired to activate the interface of FIG. 6 the Central Processor 26 in cooperation with the Interrrogator 28 will first transmit a uniquely coded signal having the general form of Line 1 of FIG. 4. That is, the Interrogator 28 will in time sequence generate a turn-on pulse of duration $t_a$, then return the Bi-directional Line 30 to the quiescent voltage level for $t_d$ seconds and then generate a second ground pulse of duration $t_c$; i.e. an end of data turn-off signal as opposed to an actuator turn-off signal. After a predetermined time or upon demand the Interrogator 28 will transmit a third ground pulse of duration $t_b$ identified as an actuator turn off signal. The turn-on pulse $t_a$, end of data pulse $t_c$, and actuator turn-off pulse $t_b$ can be recognized by one and only one of each of the many pulse width discriminators within the system, in particular, Pulse Width Discriminators 158, 163 and 162 respectively.

Upon recognizing the turn-on pulse $t_a$ the Pulse Width Discriminator 158 will simultaneously Set the actuator Flip-Flop 164 which turns on the Actuator and places the data Flip-Flop 167 in a Set state. The next pulse to be received by the Actuator Interface is the end of data pulse $t_c$. The third Pulse Width Discriminator 163 generates an output signal which upon recognition of the $t_c$ pulse resets the data Flip-Flop 167. The length of time that the data Flip-Flop 167 is Set is indicative of the data sent and is sensed by the Pulse Width-To-Analog Converter 172 which produces an equivalent analog signal. Upon recognition of the turn-off pulse $t_b$ the output of the Pulse Width Discriminator 162 resets actuator Flip-Flop 164 thereby turning off the actuator. In addition, the output of the Discriminator 162 is communicated to the data Flip-Flop 167 through OR Gate 165 thereby insuring that the circuit is reset and ready to accept later sent signals.

The detailed discussion of a pulse width discriminator is presented in conjunction with the detailed description of the Sensor Interface.

Referring now to the circuitry of FIG. 7 there is shown a Sequencer 50, that is capable of sequentially interrogating the remote Sensor Interfaces in a predetermined order. The format of FIG. 7 follows the flow of FIG. 2.

The Sequencer 50 comprises an Oscillator 200, a 4 Bit Binary Counter 202, and a Decade Decoder 204. The output of the Oscillator 200 is connected to the input of the Counter 202. Typically, the Counter 202 contains a plurality of output terminals corresponding to each bit of an n-bit counter. A four bit counter will therefore contain for signal output terminals. Appropriate outputs of the Counter 202 are connected to the input terminals of the Decoder 204 to permit the separate activation of remote units. In addition the Decoder 204 requires the synchronizing signal from Oscillator 200. In the embodiment shown in FIG. 7, the Oscillator 200 can utilize a portion of an SE 556 Dual Timer, manufactured by Signetics Corporation of Sunnyvale, California. The Counter 202 and Decoder 204, can be of the type similar to that manufactured by Texas Instruments of Dallas, Texas and are respectively a 4-Bit Binary Counter SN 7493A and a BCD-decimal Decoder SN 7442A. Regulated power is supplied to the Sequencer 50 and Interrogator 28 by a Voltage Regulator 206 such as a Signetics (mu) AT805. Three of the ten decoder outputs are shown communicating with the Pulse Width Generator 52.

The Pulse Width Generator 52 comprises a plurality of one shots, Monostable Multivibrators 208a through 208c and OR Gate 214. One skilled in the art will realize that the invention is not limited to the three multivibrators shown. Additional multivibrators may be added as addtional interfaces are added to the system with the appropriate modification to the Counter 202 and Decoder 204. The number of multivibrators within the Pulse Width Generator 52 is equal to the number of distinct pulse width signals necessary to communicate with the remotely located units.

Three outputs of Decoder 204 are separately connected to the Trigger input terminal (Tr) of the Monostable Multivibrators 208a, b and c through AC coupling Capacitors 207a, b and c respectively. The output (O) of Monostable Multivibrator 208a is connected to the Trigger (Tr) input of a Resettable Monostable Multivibrator (MMV) 56a via AC coupling capacitor 209a and to one input of OR Gate 214. The output of the Resettable MMV 56a is connected to the signal input of the Pulse Width to Digital Converter 40. In a similar fashion the outputs of MMV 208b and MMV 208c are separately communicated to the trigger input of the Resettable MMV 56b and 56c via the AC coupling Capacitors 209b and 209c. In addition, the output of MMV's 208b and 208c are connected to alternate inputs of the OR Gate 214.

The circuit of FIG. 7 can utilize separate Multivibrators 208a, 208b, 208c and separate Resettable Multivibrators 56a, 56b and 56c or the circuit can employ a plurality of dual resettable monostable multivibrators such as the Signetics Timer SE556 appropriately wired wherein one-half of each dual resettable monstable multivibrator functions as the one-shot 208 and the other half functions as the resettable Monostable Multivibrator 56.

The signal output of the OR gate 214 is in essence the composite output of the Pulse Width Generator 52. The OR Gate 214 is connected to Voltage Level Shifter 53 which is connected to the Bi-directional Line through the Buffer 54. The Voltage Level Shifter 53 and Buffer 54 correspond exactly to those blocks of FIG. 2 identified as 53 and 54. The Voltage Level Shifter 53 is a device such as the Signetics Quad Voltage Comparator/Buffer LM339. The Voltage Level Shifter 53 amplifies the lower level logic pulses produced by the Pulse Width Generator 52 into pulses having a maximum amplitude of the higher unregulated supply voltage $V_1$. The interface between the Voltage Level Shifter 53 and the Bi-directional Line 30 is provided by the Buffer 54 amplifier. In the embodiment shown in FIG. 7 the Buffer 54 comprises the previously unused portion of the SE556 Dual Timer used for Oscillator 200 of the Sequencer 50.

Returning briefly to FIG. 2, it is noted that the signals generated by Interrogator 28 are current limited (55), that Inhibit Circuitry 62 is necessary to prevent inappropriate resetting of the multivibrator 56 and a Comparator/Voltage Level Shifter 60 is necessary to buffer the incoming Sensor 22 transmitted reply signals. The preferred embodiment of Blocks 55, 60 and 62 are contained in the Composite Circuit 220 shown in FIG. 7. The output of Buffer 54 is connected to a voltage divider network comprising Resistances 223, 224, and 225. One terminal of the Resistor 224 and one terminal of Resistor 223 are connected to the Buffer 54 at a common Node N1 (229). The other terminal of Resistor 224 is connected to one terminal of Resistor 225 at Node N2 (230). The remaining terminals of Resistors 223 and 225 are connected in common to Node N3 (231). Node N3 is connected to the base of Transistor 222. Node N2 can be viewed as the beginning of the Bi-directional Line 30. Node N1 is connected to the Emitter of Transistor 222. The collector of Transistor 222 is connected to one Terminal of Resistor 226 which is part of the resistor divider network comprising the series combination of Resistances 226 and 228. The common Node, N4 (233) between Resistors 226 and 228 is connected to the base of Transistor 234. The emitter of Transistor 234 and the other terminal of Resistor 228 are connected to ground. The output or collector voltage of Transistor 224 provides the reset signal which is applied to Line 236 and is communicated to the Reset terminals of each Resettable MMV 56 and the Reset terminal of Pulse Width-to-Digital Converter 40.

The collector of Transistor 234 is connected to one terminal of the biasing Resistor 227. The remaining terminal of Resistor 227 is connected to the output of the three terminal Voltage Regulator 206.

The current limiting function shown in Block 55 of FIG. 2 is provided by the dropping Resistor 224. The interrogator pulse-reset-inhibit function of Inhibit Circuitry 62 and Comparator/Voltage Level Shifter 60 are achieved by the combination of the PNP Transistor 222 and voltage divider network comprising Resistors 223, 224, and 225 in cooperation with the combination of biased NPN Transistor 234, the voltage divider of Resistances 226 and 228 and the Biasing Resistor 227.

The operation of the Sequencer 50 and Interrogator 28 combination is discussed with reference to the timing and signal waveforms of FIG. 8. The Oscillator 200 produces a continuous series of pulses that are counted by the Counter 202. The Counter 202 will accumulate the oscillator pulses resetting each sixteenth pulse and periodically activate appropriate bits corresponding to the number of pulses counted. In the embodiment shown a 4-bit Counter is used. When the $2^0$ and $2^1$ bits and oscillator synchronizing pulse are activated the Decoder 204 outputs signals at its second, fourth and sixth outputs corresponding to Terminals Nos. 1, 3, and 5 as shown in FIG. 7. The mode of operation of sequential pulse generating circuitry is well known in the art and will not be discussed further. The periodic output of the Sequencer 50 is shown on Line 1 of FIG. 8.

The Sequencer 50 pulses are communicated to the input channels of the Pulse Width Generator 52 causing the Pulse Width Generator 52 to generate a repeating sequence of chronologically discrete pulses of duration $t_1$, $t_2$, and $t_3$ etc. The composite signal output of the Pulse Width Generator 52 (i.e. OR Gate 214) is shown on Line 2 of FIG. 8. The output signal of the Pulse Width Generator 52 is the composite of the signals generated by the Monostable Multivibrators 208a, b and c. The output of the Multivibrators 208a, b and c will selectively go high when serially triggered by the negative going edge of the Sequencer 50 generated pulses. The timing period each of these multivibrators is governed by a resistor-capacitor pair (not shown) wherein each resistorcapacitor pair is calibrated to produce a pulse width of differing duration $t_1$, $t_2$, $t_3$, etc. such as 10, 15 and 20 milliseconds. The output of Multivibrators 208a, b and c are shown on Lines 3, 4 and 5 of FIG. 8. The negative going edge of each of the output signals of each Multivibrator 208a, b and c triggers one of the Resettable Monostable Multivibrators 56a, b and c to their Set state as shown in Lines 7, 8 and 9 of FIG. 8. Each Resettable MMV 56 will reset upon receipt of a Sensor 22 transmitted reply signal.

The low level regulated $V_2$ output of the Pulse Width Generator are amplified, level shifted to the value of the unregulated supply voltage $V_1$ see FIG. 7. This amplified output signal is communicated to the Buffer 54. During periods when the system is in its quiescent state, that is, when no pulses are being sent or received by the Interrogator 28 the Buffer 54 maintains the Bi-direction Line 30 at a voltage potential nearly equal to that of the supply voltage $V_1$, less the small drop the current limiting across Resistor 224. During those instants when interrogation pulses are produced the output of the Voltage Level Shifter 53 causes the Buffer 54 output to change from a voltage potential of $V_1$ to virtually ground level signal as shown on Line 6 of FIG. 8. The signal level of the Bi-directional Line is shown on line 10 of FIG. 8.

The operation of the Composite Circuitry 220 incorporating the functions of the Current Limiter 55, Voltage Level Shifter 60, and interrogation pulse Inhibit Circuitry 62 is as follows.

In the quiescent state wherein no interrogation pulses are being sent or reply pulses received Node N1 (229) is at the supply voltage level $V_1$, Node N2 (230) is at a slightly diminished voltage level due to the drop across Resistor 224. The voltage developed across the base to emitter junction; i.e. between Nodes N2 and N3 is insufficient to turn Transistor 222 into its conducting state.

Figure 10:
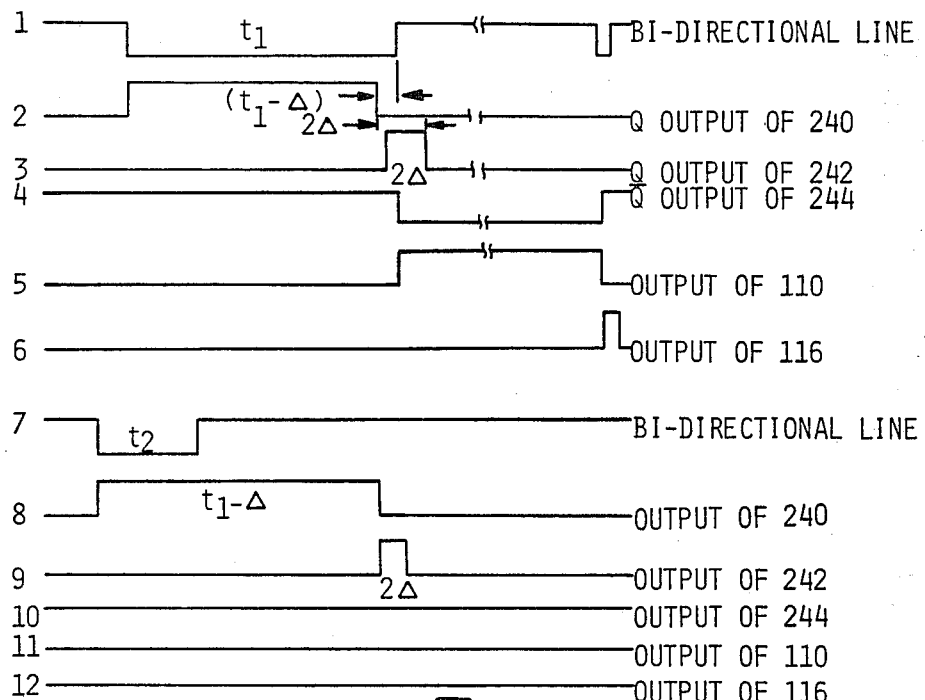
FIG. 10 includes waveforms generated by the circuit of FIG. 9.
Figure 12:
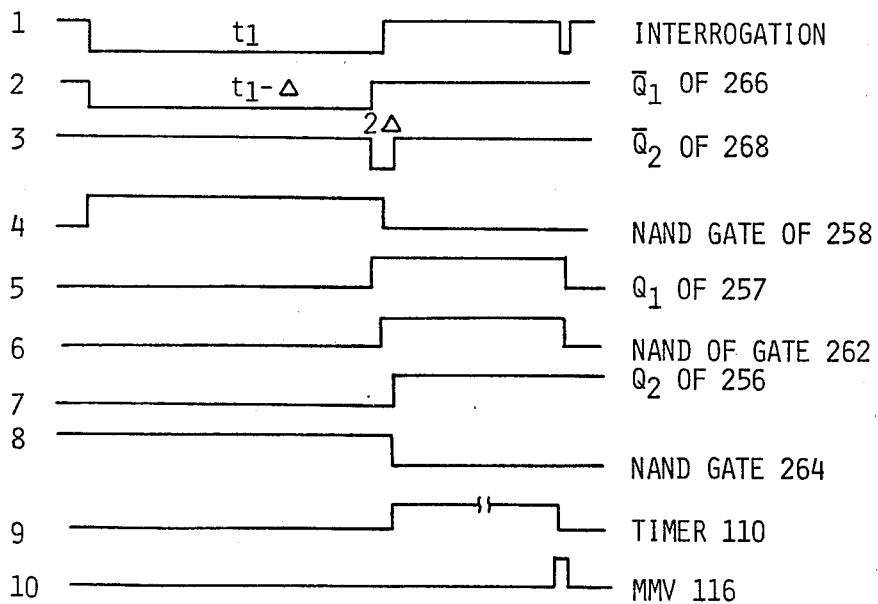
FIG. 12 includes waveforms generated by the circuit of FIG. 11.

Since Transistor 222 is off this in turn causes the NPN Transistor 234 to also be off. Hence, the collector of Transistor 234 will be maintained at the regulated supply voltage, $V_2$ of Voltage Regulator 206. This positive potential is communicated via line 236 to the reset terminals of the Resettable Monostable Multivibrators 56a, 56b and 56c which are used as the data pulse storage devices. During the transmission of an Interrogator 28 sent pulse the output of Buffer 54 will be clamped to ground as shown in FIG. 10, Line 9. This, of course, simultaneously drops the Bi-directional Line 30 voltage, Line 10, FIG. 8. The base-to-emitter voltage of Transistor 222 similarly goes to ground potential and Transistor 222 remains in its off or nonconducting state, thereby not causing a change in the status of the reset signal voltage on Line 236 and permitting it to remain at about $V_2$ volts, thereby achieving the interrogator pulse inhibit function.

The handling of a Sensor 22 transmitted reply signal is as follows. As previously discussed, the reply signal is a momentary signal of ground potential that did not originate in the Interrogator 28. The precise mechanics for generating the reply signal was previously discussed during the detailed discussion of the Sensor Interface 34 circuitry. The reply signal on Bi-directional Line 30 pulls Node N2 (230) to ground potential causing the supply voltage potential to appear across Nodes N1-N2. This is because the output of the Buffer 54 is nominally at supply potential except during an Interrogator 28 transmitted pulse.

A voltage potential sufficient to put Transistor 222 into conduction is developed across base-emitter junction of Transistor 222 and a positive voltage is developed at the base of Transistor 234. Transistor 234 becomes conductive, thereby pulling its collector voltage nearly to ground potential. The collector of Transistor 234 will remain at this low voltage as long as the Sensor 22 reply signal remains on Bi-directional Line 30. This change in collector voltage, in response to the Sensor 22 reply signal, is the reset signal resetting the Resettable Monostable Multivibrators 56a, 56b, and 56c. The sensor transmitted reply signal as well as the reset of each Multivibrator 56 output is shown on lines 7 through 10 of FIG. 8. As previously discussed, the length of time each data pulse storage device, i.e., MMV 56 remains in its Set state is a measure of the remotely sensed variable. The time duration is measured from the termination of the interrogator pulse to the receipt of the reply pulse.

If for some reason a reply signal is not sent by a remote device or reset signal not generated by Transistor 234, the Resettable Monostable Multivibrators 56 will automatically return themselves to their quiescent state. The period of the automatic reset is of the order of magnitude of the time between the pulses generated by Sequencer 50.

Figure 11:
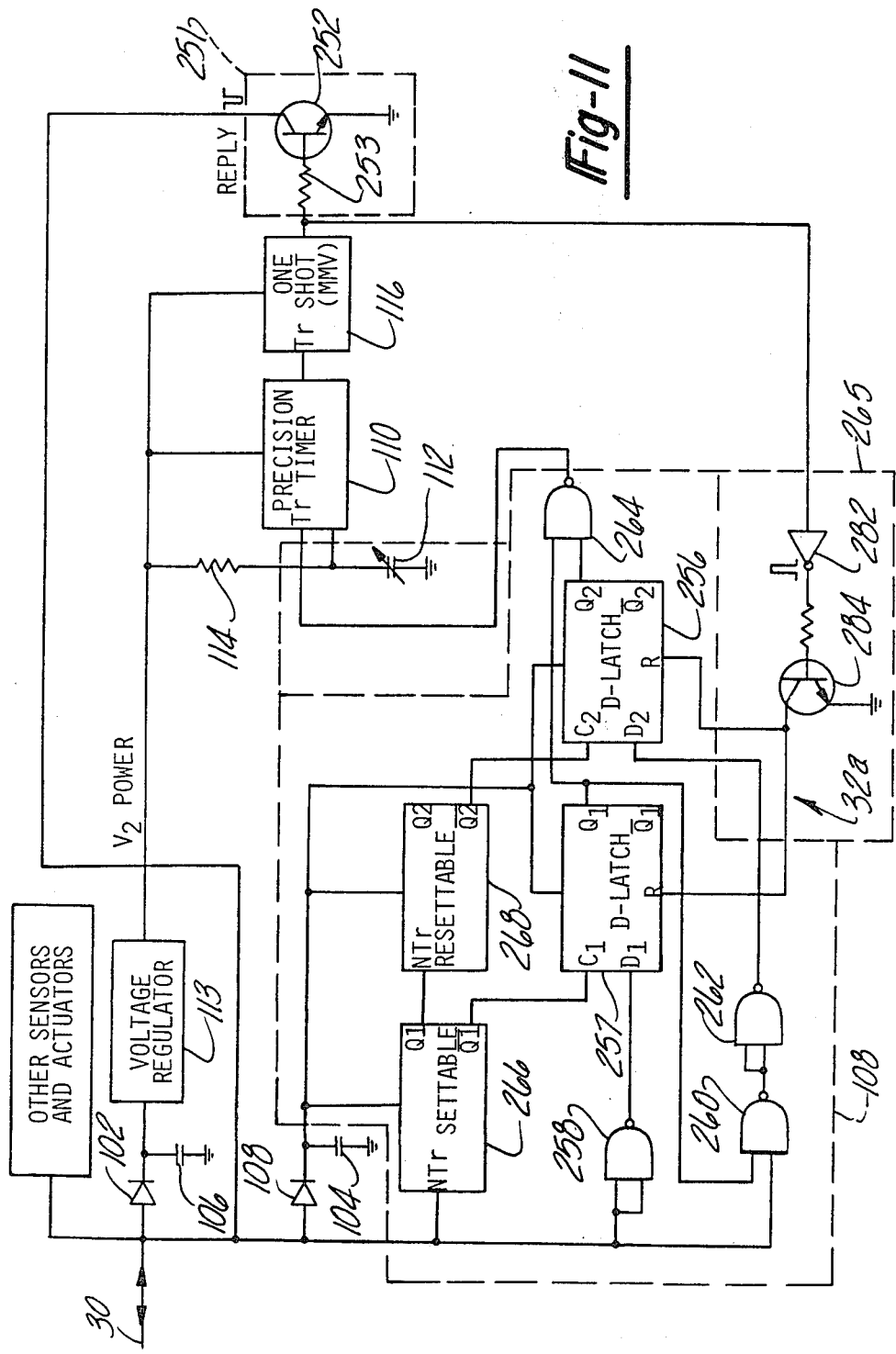
FIG. 11 illustrates an alternate embodiment of the Sensor Interface in particular an alternate embodiment of the pulse width discriminator circuitry of FIG. 9.

Referring now to FIG. 9 there is shown the detail embodiment of a typical Sensor Interface 32. FIG. 10 contains signals generated by the Sensor 24 and Sensor Interface 32 of FIG. 8. FIG. 11 contains an alternate implementation of a pulse width discriminator of FIG. 9.

Referring back to FIG. 9 there is shown a Sensor-Interface 32 illustrative of one of the many sensor interface units connected to the Bidirectional Line 30. The Sensor Interface 32, as previously described during the discussion of FIG. 2, comprises the Energy Storage Capacitor 106 and discharge protection Diode 102 communicating with a three terminal Voltage Regulator 113. The regulator can be similar to that used to power the Sequencer 50 in the Interrogator 28 circuitry and compatible with the power requirements of the interface circuitry.

The voltage Regulator 113 powers and is connected to the power terminal of the Precision Timer 110 and a one shot, Monostable Multivibrator (MMV) 116. The Timer 110 and MMV 116 in the preferred embodiment are a single I.C. chip such as the Signetics SE556; however, the consolidation of the Timer 110 and the MMV 116 are not essential to the invention. The output of the MMV 116 is connected to a Buffer 251 comprising a single NPN Switching Transistor 252 and Resistor 253 as opposed to the two transistor Buffer 118, comprising Transistors 120 and 122 as detailed in FIG. 2. The remainder of the Sensor Interface 32 comprises for the most part the Pulse Width Discriminator 108, power storage Capacitor 104 and discharge protection Diode 100, as previously described in FIG. 2. The Bi-directional Line 30 is connected to the signal input terminal of the Pulse Width Discriminator 108 which is the negative edge trigger (NTr) terminal Monostable Multivibrator (MMV) 240. MMV 240 is connected to produce a test pulse of duration $(t_1 - \Delta)$. The Q output terminal of MMV 240 is connected to the negative edge trigger terminal (NTr) of MMV 242. MMV 242 is designed to produce a relatively short second test pulse of duration $2\Delta$ seconds. The Q output of MMV 242 is connected to the data (D) input terminal of the D-Latch 244 flip-flop. The D-Latch 244 clocking signal is obtained by connecting the Bi-directional Line to the clock (C) terminal of the D-Latch 244. The complementary output of D-latch 244 is communicated via AC coupling Capacitor to the negative edge trigger terminal (NTr) of Precision Timer 110. The period of Timer 110 is uniquely specified by the Resistor 114-Capacitor 112 combination, as previously discussed, recalling that either the Capacitor 112 or Resistor 114 is in fact a variable capacitance or resistance Sensor or equivalent. A variable capacitive Sensor is illustrated in FIG. 9. The output of the Timer 110 is connected to the Trigger (Tr) terminal of MMV 116 which is designed to generate very short, perhaps 1 m. sec. pulse.

The output of MMV 116 is communicated both to input terminals of the Buffer 251 and Reset Circuitry 265. The input terminal of Buffer 251 is connected to one-side of Resistor 253. The outer terminal of Resistor 253 connects to the base terminal of Transistor 252. The emitter terminal of Transistor 252 is connected to ground and the collecter terminal connected to the Bi-directional Line 30. The output of MMV 116 is also communicated to Inverting Amplifier 282 which is the input terminal of the Reset Circuitry 265. The output of Inverting Amplifier 282 is connected to the base of NPN Transistor 284 through Resistor 283. The emitter of Transistor 284 is grounded while its collector or output is connected to the reset terminal of the D-Latch 244 flip-flop.

The two Monostable Multivibrators 240 and 242 of the Pulse Width Generator 108 may be fabricated using a COS/MOS Daul Monostable Multivibrator such as the CD4098B manufactured by RCA. The D-Latch 244 can be a CMOS dual D Flip-Flop such as the National Semiconductor CD4013M or CD4013C.

Each Sensor 22 will communicate with a separate, dedicated Sensor Interface 32. Each Sensor Interface 32 will be responsive and be able to recognize one and only one Interrogation pulse of a predetermined length, $t_i$. The following discussion illustrates the design and operation of a typical Sensor Interface 32 of FIG. 9; one that has been designed to be responsive to an interrogator pulse of $t_i$ milliseconds. The interrogator pulse is shown on Line 1 of FIG. 10.

The Bi-directional Line 30 as mentioned previously is maintained at a voltage approximately equal to the supply potential $V_1$ typically 12 to 14 volts. Power is transmitted from the Bi-directional Line 30 to a storage Capacitor 104 through a diode 100. Diode 100 is polarized to permit the flow of current from the Bi-directional Line 30 into the storage Capacitor 104. The Storage Capacitor 104 is connected to the cathode of Diode 100 thereby preventing capacitor discharge during those instants of time when the Bi-directional Line 30 is at a lower potential than Capacitor 104. The remaining terminal of Capacitor 104 is grounded thus placing the stored voltage across the power terminal of the Pulse Width Generator 108. Input data such as the length of an interrogation pulse is communicated to the data input of the Pulse Width Generator 108 from the Bi-directional Line 30. The leading edge or negative going edge of the interrogation pulse, shown on Line 1 of FIG. 10, triggers Multivibrator 240 to generate the first test pulse shown on Line 2 of FIG. 10. The trailing edge of the output of Multivibrator 240 triggers Multivibrator 242 to generate a second test pulse shown on Line 3 of FIG. 10. The output of Multivibrator 242 is connected to the Data Terminal of the D-Latch Flip-Flop 244. The Bi-directional Line 30 is connected to the Clock input of D-Latch 244. The signal appearing on the Data (D) terminal of D-Latch 296 will be transferred to output or Q terminal upon the positive-going or trailing edge of the interrogation pulse. For pulse width recognition to occur the interrogation pulse must be present; i.e., the Bi-directional Line 30 at ground potential, during a first test pulse of duration $(t_1 - \Delta)$; this will always be true since the interrogation pulse triggers the first test pulse, as shown on lines 1 and 2 of FIG. 10 and terminated during the duration of the second test pulse having a duration of the order of 1 m.sec. The second test pulse produces a high signal at the input data (D) terminal of the D-Latch 244 for a duration of $2\Delta$ seconds, occurring $(t_1 - \Delta)$ seconds after the receipt of the negative going edge of the interrogation pulse. The complementary $\overline{Q}$ output of the D-Latch 244 will go through a negative-going transition when the Clock (C) terminal is triggered by the positive going edge of any pulse on the Bi-directional Line 30. This clock pulse transfers the signal on the D terminal to the Q output terminals of the D-Latch 244 and the $\overline{Q}$ output terminal assumes a ground potential as shown on line 4, FIG. 10. It can be seen from FIG. 10 that for the D-Latch 244 to generate an output signal requires the time correspondence between the second test pulse and the termination of the interrogation pulse. The correspondence between these two signals is indicative of pulse width recognition, i.e., discrimination, of an interrogation pulse of length $t_1$ and will occur in only one pulse width discriminator because each pulse width discriminator has been designed to generate a first test pulse of a different duration. The negative going edge of the complementary ($\overline{Q}$) output of D-Latch 244 is connected through AC coupling Capacitor 246 which triggers the precision Timer 110. The period of Timer 110, as previously discussed, is defined by the Resistor 114-Capacitor 112 pair wherein Capacitor 112 can be a variable capacitive sensor. As the value of Capacitor 112 changes in response to some physical parameter, the period of the output of Timer 110 will vary in proportion to changes in capacitance. The output of Timer 110 is shown on Line 5 of FIG. 10.

The termination of the output signal of Timer 110 is used to trigger Monostable Multivibrator (MMV) 116. The output of MMV 116 is connected to the reply signal Buffer 251. The momentary output signal of Multivibrator 116 places Transistor 252 in a conductive state, thereby causing a virtual ground potential at the collector of Transistor 252. The collector of Transistor 252 is connected directly to the Bi-directional Line 30. The clamping of Transistor 252 to ground similarly places the Bi-directional Line 30 at ground potential for the duration of the output pulse of Multivibrator 116. This momentary grounding of the Bi-directional Line 30 is the reply signal which is communicated to the Interrogator 28.

To ready the Sensor Interface 32 for the next interrogation signal, it is necessary to reset appropriate circuits within the Pulse Width Discriminator 108. To achieve the reset signal, the output of MMV 116 is connected to the input terminal of Inverting Amplifier 282 of the Reset Circuit 265. In the quiescent state, the output of Inverting Amplifier 282 has a positive potential, causing Transistor 284 to be conductive placing a ground signal at the collector of Transistor 284. The reply pulse generated by Multivibrator 116 momentarily drops the output of Inverting Amplifier 282 to ground, thereby turning off Transistor 284 and generating the reset signal resetting the Pulse Width Generator 108.

the preceding discussion has detailed the operation of the Pulse Width Discriminator 108 showing the process of pulse discrimination or recognition. The following discussion briefly illustrates the process of pulse width nonacceptance. Referring again to FIG. 9, it is recalled the Pulse Width Generator 108 as been designed to be responsive to a pulse of $t_1$ seconds. Let it be assumed that the Interrogator 28 now produces a pulse of duration $t_2$ seconds as shown on Line 7 of FIG. 10. The negative going edge of the interrogation pulse triggers Multivibrator 240 as did the previous pulse of duration $t_1$. Multivibrator 240 generates the first test pulse of duration $t_1 - \Delta$. When the shortened pulse $t_2$ terminates, it toggles the clock terminal of D-Latch 244. Since the output of Multivibrator 242 is low, the clock pulse does not change the state of the complementary $\overline{Q}$ output of D-Latch 244. Hence, the precision Timer 110 is not triggered, a reply pulse is not generated and the interrogation pulse of duration $t_2$ is ignored. The subsequent generation of the second test pulse from Multivibrator 242 does nothing to affect the state of D-Latch 244.

an alternate embodiment of the Sensor Interface 32 is shown in FIG. 11. The difference between the embodiment of FIG. 9 and that of FIG. 11 is the mechanization of the Pulse Width Discriminator 108. In particular, the Pulse Width Discriminator 108 utilizes two Resettable Monostable Multivibrators 267 and 268, two D-Latch Flip-Flops 257 and 256 and four NAND Gates 258, 260, 262 and 264. The embodiment of FIG. 11 requires that these components are CMOS compatible. MMV's 266, 267 and 268 can be of a type similar to the National Semiconductor CD4013M/CD 4013C dual D flip-flop, and the NAND Gates 258, 260, 262 and 264 similar to the National Semiconductor dual 4-input NAND Gate CD4012M/CD4012C.

Power is supplied to the Resettable Monostable Multivibrators (MMV) 226 and 268 and D-Latch 256 and 257 from the output terminal of Storage Capacitor 104. The Bi-Directional Line 30 is connected to the negative edge triger terminal (NTr) of MMV 266. The Q1 output of MMV 266 is connected to the negative edge trigger (NTr) of MMV 268 and its complementary output ($\overline{Q2}$) of MMV 268 is connected to the Clock (C2) input of D-Latch 256. In a similar fashion the complementary output ($\overline{Q1}$) of MMV 266 is connected to the Clock (C1) input of D-Latch 257. The Monostable Multivibrator 266 is so configured to generate, when triggered, a first test pulse of duration $(t_1 - \Delta)$ seconds and MMV 268 to generate a second test pulse of duration $2\Delta$ seconds. The generation of these two test pulses is analogous to those test pulses generated in the embodiment of FIG. 9.

The Bi-directional Line 30 is connected to both inputs of NAND Gate 258. The output of NAND Gate 258 is connected to the (D1) input terminal of D-Latch 257. It should be recognized that the NAND Gate 258 will invert the signal appearing on the Bi-directional Line 30. The Bi-directional Line 30 is similarly connected to one of the input terminals of NAND Gate 260, the other input terminal of NAND Gate 260 is connected to the output (Q1) of D-Latch 257. The output (Q1) of D-Latch 257 is also communicated to one input terminal of NAND Gate 264. The output of NAND Gate 260 feeds both input terminals of NAND Gate 262. The output of NAND Gate 262 is connected to the (D2) data terminal of D-Latch 256. The output of D-Latch 256 is fed to the other input terminal of NAND Gate 264. The output of NAND Gate 264 is connected to the trigger (Tr) input terminal of Timer 110. The Reset terminals of D-Latch 256 and 257 ae connected to the collector of Transistor 284. The remainder of the Sensor Interface 32 is identical with that dicussed in conjunction with FIG. 9. The operation of the alternate Pulse Width Discriminator 108 will be discussed with the aid of the waveforms contained on FIG. 12.

The Bi-directional Line 30 as mentioned previously is maintained at a voltage approximately equal to the supply potential $V_1$ typically 12 to 14 volts. Power is transmitted from the Bi-directional Line 30 to a storage capacitor 104 through a Diode 100. Diode 100 is polarized to permit the flow of current from the Bi-directional Line 30 into the storage Capacitor 104. The Storage Capacitor 104 is connected to the cathode of Diode 100 thereby preventing capacitor discharge during those instants of time when the Bi-directional Line 30 is at a lower potential than Capacitor 104. The remaining terminal of Capacitor 104 is grounded thus placing the stored voltage across the power terminal of the alternate Pulse Width Generator 108. Input data such as the length an interrogation pulse is communicated to the input of the pulse width discriminator from the Bi-directional Line 30. The MMV 266 is so configured such that it is triggered by the leading or negative-going edge of the input interrogation pulse. A typical input interrogation pulse appearing on the Bi-directional Line 30 and having a duration of $t_1$ is shown on Line 1 of FIG. 12. Upon being triggered the first monostable multivibrator 266 generates a first test pulse of period $(t_1 - \Delta)$. The complementary $\overline{Q1}$ output of this multivibrator 266; i.e. the first test pulse, is shown on Line 2 of FIG. 12. Upon the termination of the first test pulse a second test pulse of duration $2\Delta$ is generated by the second Monostable Multivibrator 268. The negative-going edge of the $Q_1$ output of Multivibrator 266 (not shown in FIG. 12) is used to trigger Multivibrator 268. The signal level of this second test pulse, $\overline{Q_2}$ output of Multivibrator 266, is shown on Line 3 of FIG. 12.

The Bi-directional Line 30 is similarly connected to the input terminals of NAND Gate 258 and one of the input terminals of NAND Gate 260. The purpose of the NAND Gate 258 is to invert the signal on the Bi-directional Line 30. The output of NAND Gate 258 is shown on Line 4 of FIG. 12. The input signal at the $D_1$ data input terminal will be transferred to the $Q_1$ output during the positive going transition of the clock pulse on the Clock (C1) terminal. In essence, the state of the inverted Bi-directional Line 30 signal will be transferred to the $Q_1$ output of the D-Latch 257 upon the termination of the first test pulse.

When the clocking pulse, the complementary output of MMV 266 rises positively after $(t_1 - \Delta)$ seconds, it will cause the signal appearing on the D1 input of the D-Latch 257 to be transferred to the Q1 output of D-Latch 257. This is shown on Line 5 of FIG. 12. The significance of a high Q1 output is that it indicates that the first part of the two-step recognition test has been passed; i.e. the interrogation pulse of duration $t_1$ or greater existed at the termination of the first test pulse of duration $(t_1 - \Delta)$.

The output of NAND Gate 260 is normally high and will go low at that instant corresponding to absence of the Q1 output and the absence of the interrogation pulse. The signal is inverted by NAND Gate 262 and comprises the data input signal for D-Latch 256 and is shown on Line 6 of FIG. 12. The output of MMV 268 clocks the D-Latch 256 transferring the signal appearing on the data D2 terminal to the Q2 output terminal. The output of D-Latch 256 will go high only when the signals indicative of the termination of the interrogation pulse; i.e. the output of the NAND Gate 262, and the second test pulse occur together. The output of NAND Gate 264 is high during the system quiescent operation and will go low at that instant when both input signals are high indicative of the fact that both tests have been passed, thereby completing the process of pulse width discrimination. The negative-going output of NAND Gate 264 will trigger the Timer 110 thereby generating reply and reset signals as previously discussed.

One skilled in the art will realize that data input signal for D-Latch 256 could have been supplied by using the Q2 output of the MMV 268 and the clocking signal similarly supplied by output of the NAND Gate 262.

I claim:

1. A pulse width discriminator having an input terminal adapted to receive signals where one of said signals has a pulse width of duration $t_1$, said pulse width discriminator comprising:

first means responsive to the beginning of each signal appearing at the input terminal line, for generating a first test pulse of duration $(t_i - \Delta)$;

second means, responsive to the termination of said first test pulse for generating a second test pulse having a duration $2\Delta$ wherein $2\Delta$ corresponds to a time increment smaller than $t_i$ wherein said first means includes a first monostable multivibrator for generating said first test pulse, in response to the beginning edge of said received signals, and wherein said second means includes a second monostable multivibrator disposed between said first and a third means responsive to the termination of said first test pulse for generating said second test pulse; and third means, responsive to said signals and said second test pulse, for generating a trigger signal indicative of the condition that said signal of duration $t_i$ has terminated during the time of said second test pulse and wherein said third means includes a D-latch flip-flop having a data input terminal and a clock input, said D-latch flip-flop receiving said second test pulse at said data input terminal and connected so that the state of the flip-flop is clocked by the trailing edge of the received signals.

2. A pulse width discriminator having an input terminal adapted to be connected to a transmission line to receive a negative logic pulse width signal having a time duration of $t_i$, said pulse width discriminator comprising:

first means connected to said transmission line, including a first monostable multivibrator (266), generating an output signal and a complementary output signal responsive to the negative going edge of a pulse width signal on said transmission for generating a first test pulse of predetermined duration $(t_i - \Delta)$;

second means including a second monostable multivibrator (268) generating an output signal and a complementary output signal connected to the output of said first means responsive to the negative going edge of the signal appearing at the output of said first means for generating a second test pulse signal of predetermined duration $2\Delta$;

a logic signal inverter including a first NAND gate (258) connected to said transmission line;

D-latch flip-flop (257) receiving a data input signal from the output of said logic signal inverter and receiving a clock signal from the complementary output of said first means;

a second NAND gate (260) receiving inputs from said transmission line and the output of said D-latch flip-flop (257) and generating an output;

a second logic signal inverter, including a third NAND gate (262) receiving the output of said second NAND gate (260);

second D-latch flip-flop (256) responsive to the output of said second logic signal inverter and further receiving a clocking signal from the complementary output of said second means; and fourth NAND gate means (264) responsive to the output of said second D-latch flip-flop (256) and the output of said first D-latch flip-flop (257) for generating said trigger signal indicative of the condition that said interrogation signal of duration $t_i$ has terminated during the time of said second test pulse.

3. A negative logic pulse width discriminator for detecting a particular negative logic pulse from a plurality of such pulses of different duration having a particular duration $t_i$, comprising:

a first monostable multivibrator (240) having a negative edge trigger terminal for generating at its non-inverting output terminal a first test signal having a during $t_i - \Delta$ in response to the negative going leading edge of the negative logic pulse, wherein $\Delta$ is small compared with the particular pulse $t_i$;

a second monostable multivibrator (242) having a negative edge trigger terminal, adapted to receive said first test signal for generating at its non-inverting output terminal a second test signal of duration $2\Delta$ in response to the negative going trailing edge of said first test signal; and a D-latch flip-flop (244) adapted to receive the negative logic pulse at its clock terminal and said second test signal at its data terminal for generating an output signal.

* * * * *